United States Patent [19]
Dobkin et al.

[11] 4,224,564
[45] Sep. 23, 1980

[54] STATISTICAL ENHANCEMENT OF THE ACCURACY OF A RATIO-MATCHED NETWORK IN A CIRCUIT CHIP

[75] Inventors: Robert C. Dobkin, Hillsborough; James B. Cecil, Santa Clara; Joseph J. Connolly, Jr., San Jose, all of Calif.

[73] Assignee: National Semiconductor Corporation, Santa Clara, Calif.

[21] Appl. No.: 911,463

[22] Filed: Jun. 1, 1978

[51] Int. Cl.² ............................................. G05F 3/00
[52] U.S. Cl. ...................................... 323/74; 307/109; 361/328
[58] Field of Search ...................... 357/41, 51; 323/74, 323/79; 307/109; 361/328

[56] References Cited
U.S. PATENT DOCUMENTS

| | | | |
|---|---|---|---|
| 3,453,529 | 7/1969 | Richman | 323/79 |
| 3,477,031 | 11/1969 | Nagata | 357/41 |
| 3,513,417 | 5/1970 | Worcester | 323/79 |
| 3,541,430 | 11/1970 | Luger | 323/79 |
| 3,644,802 | 2/1972 | Dingwall | 357/51 |

Primary Examiner—William M. Shoop
Attorney, Agent, or Firm—Brown & Martin

[57] ABSTRACT

A statistically enhanced ratio-matched network in a circuit chip is disclosed. The network may be either a resistance network or a capacitance network. In a ratio-matched resistance network, such as an R-2R resistance ladder, a plurality of resistances in a circuit chip have a rational ratio of resistance values to each other. All of the resistances each consists of an integral number of simultaneously fabricated resistors of approximately uniform dimensions, and certain critical resistances each consists of a series-parallel combination of the resistors for statistically enhancing the accuracy of the rational ratio of the critical resistances to each other.

13 Claims, 8 Drawing Figures

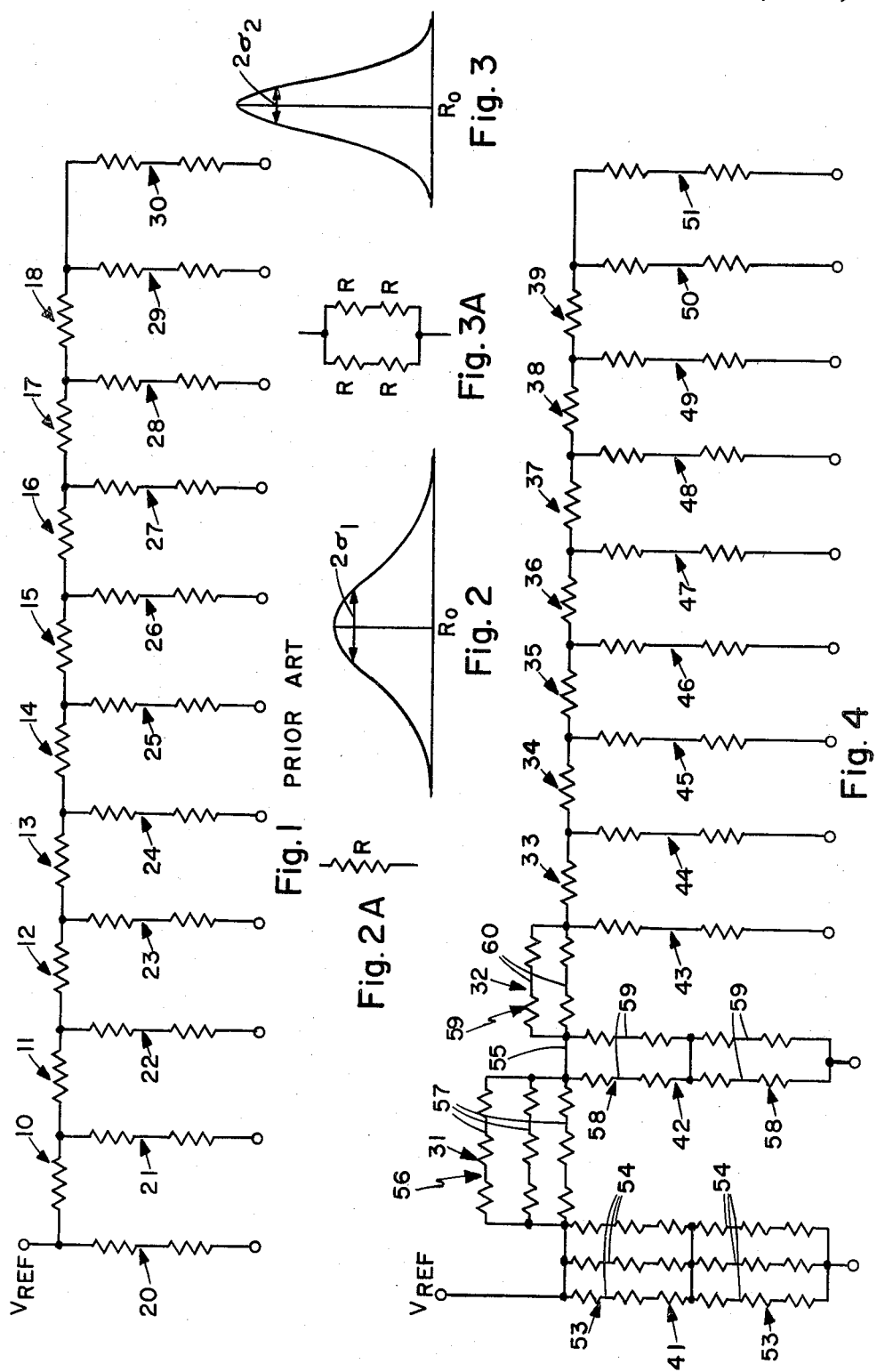

STATISTICAL ENHANCEMENT OF THE ACCURACY OF A RATIO-MATCHED NETWORK IN A CIRCUIT CHIP

BACKGROUND OF THE INVENTION

The present invention generally pertains to ratio-matched networks contained in a circuit chip, and is particularly directed to maximizing the accuracy of such networks within a given die area.

The present invention is applicable to both ratio-matched resistance networks and ratio-matched capacitance networks. A ratio-matched resistance network consists of a plurality of resistances having a rational ratio of resistance values to each other. A rational ratio is a ratio defined by a rational number. A ratio-matched capacitance network consists of a plurality of capacitances having a rational ratio of capacitance values to each other.

When a ratio-matched resistance network is included in a circuit chip, all of the resistances each consists of an integral number of simultaneously fabricated resistors of approximately uniform dimensions.

Ratio-matched resistance networks are commonly used as attenuators in signal generators, digital to analog (D/A) and analog to digital (A/D) converters, and other devices where voltages and currents must be reduced in known ratios. In integrated circuit D/A and A/D converters, an R-2R resistance ladder network is contained in a monolithic circuit chip.

A prior art ten-bit R-2R resistance ladder network is shown in FIG. 1. Such network includes a voltage reference terminal $V_{REF}$, nine resistance branches 10 through 18 connected in series to the voltage reference terminal $V_{REF}$, with each branch having a given resistance R; and eleven resistance legs 20 through 30 respectively connected to ends of each series resistance branch, with each leg having a resistance 2R. The legs 29 and 30 are connected in parallel at the end of the series resistance branch 18 that is the most remote from the voltage reference terminal $V_{REF}$. All of the resistances consist of one or more resistors. All of the resistors have a common nominal resistance $R_o$ with a standard deviation of $\sigma$, whereby the spread of resistance values is $2\sigma$.

The accuracy of an R-2R resistance ladder network is determined by the matching accuracy of the component resistors.

During the manufacture of matched resistors on a chip, a distribution of resistor values is obtained. Their distribution has a mean value $R_o$ and a spread of values $2\sigma$. FIG. 2 shows a resistance value distribution for a single connected resistor, as shown in FIG. 2A. The accuracy of the rational ratio of the resistances to each other can be enhanced by increasing the die area of each resistor. However, this would undesirably increase the total die area of the resistance ladder network, and thereby necessitate fabrication of a larger chip.

When a ratio-matched capacitance network is included in a circuit chip, all of the capicitances each consists of an integral member of simultaneously fabricated capacitors of approximately uniform dimensions. In contrast to a typical prior art ratio-matched resistance network wherein a resistance having a value of 2R consists of a pair of resistors of nominal value $R_o$ connected in series with each other, in a typical prior art ratio-matched capacitance network, a capacitance having a value of 2C consists of a pair of capacitors of a nominal value $C_o$ connected in parallel with each other. In respect to the relationship between the size of the die area of each capacitor and the accuracy of the rational ratio of the capacitances to each other, the same considerations prevail as for the ratio-matched resistance network in a circuit chip discussed hereinabove.

SUMMARY OF THE INVENTION

According to the present invention, in a circuit chip, a ratio-matched resistance network, consisting of a plurality of resistances having a rational ratio of resistance values to each other, wherein all of the resistances each consists of an integral number of simultaneously fabricated resistors of approximately uniform dimensions, is characterized by at least one of the resistances consisting of a series-parallel combination of the resistors for statistically enhancing the accuracy of the rational ratio of the one resistance to another resistance in the network. Typically, a ratio-matched resistance network includes only a few resistances as to which resistance value is critical to the accuracy of the network. In accordance with the present invention, these critical resistances each consists of series-parallel combinations of the resistors for statistically enhancing the accuracy of the rational ratio of the critical resistances to each other and to the other resistances in the network. The accuracy of the network thereby can be statistically enhanced to such an extent that the individual resistors can have smaller dimensions so that the total die area need not be increased significantly.

Statistical enhancement is demonstrated by comparing FIG. 2, which shows a resistance value distribution for a separately connected resistor R (FIG. 2A) of mean value $R_o$ with standard deviation $\sigma_1$, to FIG. 3, which shows a resistance value distribution for a series-parallel combination of matched resistors R (FIG. 3A) having a mean value $R_o$ with standard deviation $\sigma_2$. It is seen that although the mean value $R_o$ of the combination is the same as the mean value $R_o$ for the separately connected resistor, the spread of values $2\sigma_2$ is much tighter than the spread of values $2\sigma_1$ for the separately connected resistor. Thus it is seen that the use of a series-parallel combination of matched resistors to replace separately connected resistors in a resistance ladder network statistically enhances the accuracy of the network.

In the description of the preferred embodiment, there is described a statistically enhanced circuit chip R-2R resistance ladder network having an equivalent circuit to the prior art R-2R resistance ladder network discussed hereinabove. Yet the statistically enhanced R-2R resistance ladder network has individual resistors of such dimensions that the total die area for the enhanced network is not significantly larger than the total die area of the prior art network.

The present invention is likewise applicable to a ratio-matched capacitance network, consisting of a plurality of capacitances in a circuit chip having a rational ratio of capacitances in a circuit chip having a rational ratio of capacitance values to each other, wherein all of the capacitances each consists of an integral number of simultaneously fabricated capacitors of approximately uniform dimensions. According to the present invention, at least one of the capacitances consists of a series-parallel combination of the capacitors for statistically enhancing the accuracy of the rational ratio of the one capacitance to another capacitance in the network.

The present invention also is applicable to ratio-matched networks of circuit elements other than resistances or capacitances in a circuit chip, wherein all of the elements each consists of an integral number of simultaneously fabricated discrete components of approximately uniform dimensions.

BRIEF DESCRIPTION OF THE DRAWINGS

FIG. 1 is a schematic circuit diagram of a prior art R-2R resistance ladder network.

FIG. 2 is a resistance value distribution curve for a separately connected resistor, such as is shown in FIG. 2A.

FIG. 3 is a resistance value distribution curve for a series-parallel combination of matched resistors, such as is shown in FIG. 3A.

FIG. 4 is a schematic circuit diagram of a statistically enhanced R-2R resistance ladder network in a circuit chip according to the present invention.

DESCRIPTION OF THE PREFERRED EMBODIMENTS

Figure 5:
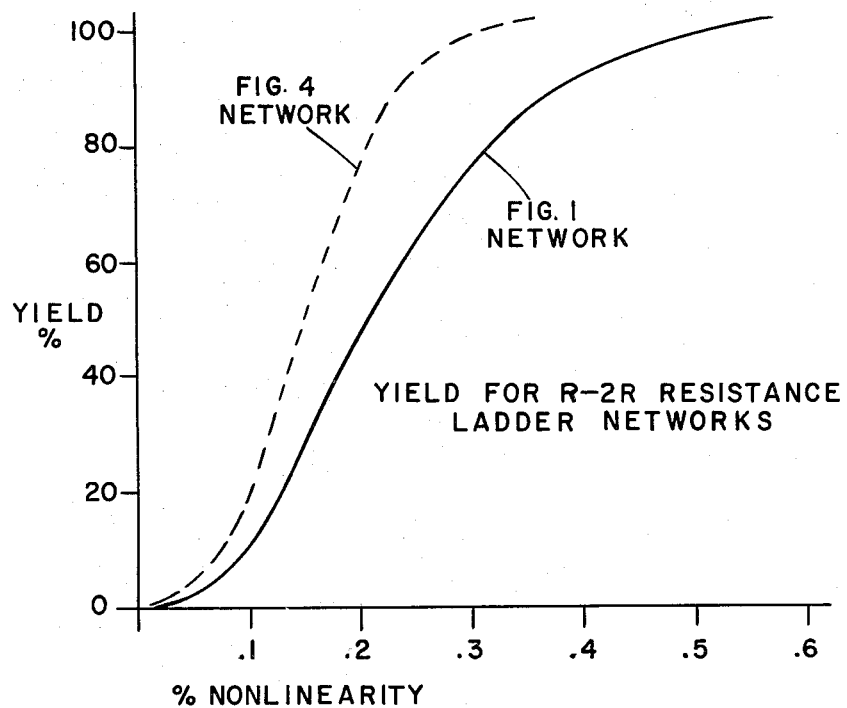
FIG. 5 is a graph comparing the yield of the networks of FIGS. 1 and 4 in relation to accuracy expressed as a percentage of nonlinearity.

Referring to FIG. 4, a ten-bit R-2R resistance ladder network according to the present invention includes a voltage reference terminal $V_{REF}$, nine resistance branches 31 through 39 connected in series to the voltage reference terminal $V_{REF}$, with each branch having a given resistance R; and eleven resistance legs 41 through 51 respectively connected to ends of each series resistance branch, with each leg having a resistance 2R. The legs 50 and 51 are connected in parallel at the end of the series resistance branch 39 that is the most remote from the voltage reference terminal $V_{REF}$. All of the resistances consist of one or more resistors. All of the resistors have a common nominal resistance $R_o$ with a standard deviation of $\sigma$, whereby the spread of resistance values is $2\sigma$.

The resistance leg 41 that is connected to the voltage reference terminal $V_{REF}$ consists of two series arms 53 of three parallel limbs 54 of three resistors each. The resistance branch 31 that is connected between the voltage reference terminal $V_{REF}$ and a juncture 55 with the next series connected resistance branch 32 consists of one arm 56 of three parallel limbs 57 of three resistors each. The resistance leg 42 connected to the juncture 55 consists of two series arms 58 of two parallel limbs 59 of two resistors each. The other series resistance branch 32 that is connected to the juncture 55 consists of one arm 59 of two parallel limbs 60 of two resistors each. The resistances R in each of the remaining seven resistance branches 33 through 39 consist of one of the resistors; and the resistances 2R in each of the remaining nine resistance legs 43 through 51 consist of two of the resistors connected in series.

Each of the individual resistors on the circuit chip in the network of FIG. 4 is of approximately identical dimensions. In one preferred embodiment as shown in FIG. 4, each of these resistors has rectangular dimensions of approximately 1.4 mils by 14 mils, and therefore has a die area of approximately 19.6 square mils. The standard deviation in resistance value is approximately 1.4%.

To demonstrate the improvement provided by the present invention, the statistically enhanced R-2R resistance ladder network of FIG. 4 is compared with the prior art resistance ladder network of FIG. 1.

For example, in the network of FIG. 1, each resistor has dimensions of approximately 2 mils by 20 mils for a die area of 40 square mils. There are 31 resistors in the prior art network of FIG. 1. Thus the total die area for the resistors of FIG. 1 is approximately 1240 square mils. The standard deviation in resistance value is approximately 190.

In the network of FIG. 4, there are 64 resistors. Thus, if each resistor has a die area of approximately 19.6 mils, the total area for the resistors of FIG. 4 is 1254.6 square mils. This is approximately the same as the total die area of the prior art network of FIG. 1.

However, the yield for the network of FIG. 4 is significantly greater than the yield for the network of FIG. 1. FIG. 5 shows curves for both networks, wherein the manufacturing yield is plotted against accuracy as expressed by a percentage of nonlinearity. By comparing these curves, it is readily seen that the accuracy of the statistically enhanced R-2R resistance ladder network of the present invention (FIG. 4) is clearly superior to that of the prior art network (FIG. 1). Only forty-eight percent of the prior art networks have an accuracy of less than 0.2% nonlinearity, whereas approximately seventy-eight percent of the networks according to the present invention have such accuracy.

Figure 6:
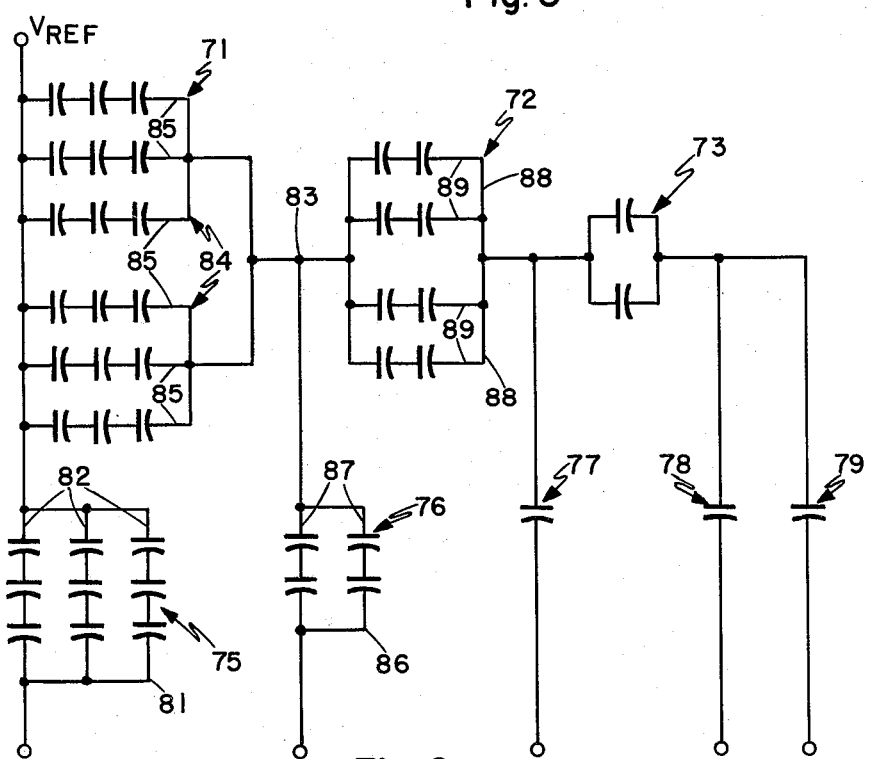
FIG. 6 is a schematic circuit diagram of a statistically enhanced C-2R capacitance ladder network in a circuit chip according to the present invention.

Referring to FIG. 6, a four-bit C-2C capacitance ladder network according to the present invention includes a voltage reference terminal $V_{REF}$, three capacitance branches 71 through 73 connected in series to the voltage reference terminal $V_{REF}$, with each branch having a given capacitance 2C; and five capacitance legs 75 through 79 connected to ends of each series capacitance branch, with each leg having a capacitance C. The legs 78 and 79 are connected in parallel at the end of the series capacitance branch 73 that is the most remote from the voltage reference terminal $V_{REF}$. All of the capacitances consist of one or more capacitors. All of the capacitors have a common nominal resistance $C_o$ with a standard deviation of $\sigma$, whereby the spread of capacitance values is $2\sigma$.

The capacitance leg 75 that is connected to the voltage reference terminal $V_{REF}$ consists of one arm 81 of three parallel limbs 82 of three capacitors each. The capacitance branch 71 that is connected between the voltage reference terminal $V_{REF}$ and a juncture 83 with the next series connected resistance branch 72 consists of two parallel arms 84 of three parallel limbs 85 of three capacitors each. The capacitance leg 76 connected to the juncture 83 consists of one arm 86 of two parallel limbs 87 of two capacitors each. The other series capacitance branch 72 that is connected to the juncture 83 consists of two parallel arms 88 of two parallel limbs 89 of two capacitors each. The capacitances 2C in the remaining series capacitance branch 73 consists of two parallel capacitors; and the capacitances C in each of the remaining three capacitance legs 77 through 79 consist of one capacitor each.

Each of the individual capacitors on the circuit chip in the network of FIG. 6 is of approximately identical dimensions.

We claim:

1. In a circuit chip, a ratio-matched resistance network, consisting of a plurality of resistances having a rational ratio of resistance values to each other, wherein all of the resistances each consists of an integral number of simultaneously fabricated equal value resistors of approximately uniform dimensions;

wherein the improvement comprises at least one of the resistances consisting of a series-parallel combination of the resistors for statistically enhancing the accuracy of the rational ratio of said one resistance to another resistance in the network.

2. A ratio-matched resistance network according to claim 1, characterized by at least two of the resistances each consisting of series-parallel combinations of the resistors for statistically enhancing the accuracy of the rational ratio of said two resistances to each other.

3. A ratio-matched resistance network according to claim 2, characterized by at least one different pair of the resistances each consisting of series-parallel combinations of the resistors that is of a different complexity than the series-parallel combinations for said two resistances, for statistically enhancing the accuracy of the rational ratio of said pair of resistances to each other to a different degree than the accuracy of the rational ratio of said two resistances to each other.

4. In a circuit chip, an R-2R resistance ladder network comprising a voltage terminal;

a plurality of resistance branches connected in series to the voltage reference terminal, with each branch having a given resistance R; and a plurality of resistance legs respectively connected to the ends of each series resistance branch, with each leg having a resistance 2R;

wherein all of the resistances consist of a integral number of simultaneously fabricated resistors of approximately uniform dimensions;

wherein the improvement comprises the resistances in the branch and the leg that are connected to the voltage reference terminal each consisting of series-parallel combinations of the resistors for statistically enhancing the accuracy of the rational ratio of the resistance of said branch to the resistance of said leg and to the other resistances in the network.

5. A resistance ladder network according to claim 4, characterized by the resistance leg connected to the voltage reference terminal consisting of two series arms of three parallel limbs of three resistors each;

the resistance branch connected between the voltage reference terminal and a juncture with the next series connected resistance branch consisting of one arm of three parallel limbs of three resistors each;

the resistance leg connected to said juncture consisting of two series arms of two parallel limbs of two resistors each; and the other series resistance branch connected to said juncture consisting of one arm of two parallel limbs of two resistors each.

6. In a circuit chip, a ratio-matched capacitance network, consisting of a plurality of capacitances having a rational of capacitance values to each other, wherein all of the capacitances each consists of an integral number of simultaneously fabricated equal value capacitors of approximately uniform dimensions;

wherein the improvement comprises at least one of the capacitances consisting of a series-parallel combination of the capacitors for statistically enhancing the accuracy of the rational ratio of said one capacitance to another capacitance in the network.

7. A ratio-matched capacitance network according to claim 6, characterized by at least two of the capacitances each consisting of series-parallel combinations of the capacitors for statistically enhancing the accuracy of the rational ratio of said two capacitances to each other.

8. A ratio-matched capacitance network according to claim 7, characterized by at least one different pair of the capcitances each consisting of series-parallel combinations of the capacitors that is of a different complexity than the series-parallel combinations for said two capacitances for statistically enhancing the accuracy of the rational ratio of said pair of capacitances to each other to a different degree than the accuracy of the rational ratio of said two capacitances to each other.

9. In a circuit chip, a C-2C capacitance ladder network comprising a voltage reference terminal;

a plurality of capacitance branches connected in series to the voltage reference terminal, with each branch having a given capacitance 2C; and a plurality of capacitance legs respectively connected to the ends of each series capacitance branch, with each leg having a capacitance C;

wherein all of the capacitances consist of an integral number of simultaneously fabricated capacitors of approximately uniform dimensions;

wherein the improvement comprises the capacitances in the branch and the leg that are connected to the voltage reference terminal each consisting of series-parallel combinations of the capacitors for statistically enhancing the accuracy of the rational ratio of the capacitance of said branch to the capacitance of said leg and to the other capacitances in the network.

10. A capacitance ladder network according to claim 9, characterized by the capacitance leg connected to the voltage reference terminal consisting of an arm of three parallel limbs of three capacitors each;

the capacitance branch connected between the voltage reference terminal and a juncture with the next series connected capacitance branch consisting of two parallel arms of three parallel limbs of three capacitors each;

the capacitance leg connected to said juncture consisting of an arm of two parallel limbs of two capacitors each; and the other series capacitance branch connected to said juncture consisting of two parallel arms of two parallel limbs of two capacitors each.

11. In a circuit chip, a ratio-matched network, consisting of a plurality of common circuit elements having a rational ratio of element values to each other, wherein all of the elements each consists of an integral number of simultaneously fabricated equal value discrete components of approximately uniform dimensions;
wherein the improvement comprises
at least one of the elements consisting of a series-parallel combination of the discrete components for statistically enhancing the accuracy of the rational ratio of said one element to another element in the network.

12. A ratio-matched network according to claim 11, characterized by
at least two of the elements each consisting of series-parallel combinations of the discrete components for statistically enhancing the accuracy of the rational ratio of said two elements to each other.

13. A ratio-matched network according to claim 12, characterized by
at least one different pair of the elements each consisting of series-parallel combinations of the discrete components that is of a different complexity than the series-parallel combinations for said two elements for statistically enhancing the accuracy of the rational ratio of said pair of elements to each other to a different degree than the accuracy of the rational ratio of said two elements to each other.

* * * * *